United States Patent
Wang et al.

(10) Patent No.: US 11,688,745 B2
(45) Date of Patent: Jun. 27, 2023

(54) DISPLAY SUBSTRATE AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Cong Wang, Beijing (CN); Seungmin Lee, Beijing (CN); Xipeng Wang, Beijing (CN); Wei Zhang, Beijing (CN); Benzhi Xu, Beijing (CN); Xin Zhou, Beijing (CN); Tao Yang, Beijing (CN); Yingmeng Miao, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/486,583

(22) Filed: Sep. 27, 2021

(65) Prior Publication Data
US 2022/0102389 A1    Mar. 31, 2022

(30) Foreign Application Priority Data
Sep. 27, 2020    (CN) .......................... 202011035306.2

(51) Int. Cl.
*H01L 27/12*    (2006.01)
*G02F 1/1368*    (2006.01)
(Continued)

(52) U.S. Cl.
CPC ........ *H01L 27/1244* (2013.01); *G02F 1/1368* (2013.01); *G02F 1/13452* (2013.01);
(Continued)

(58) Field of Classification Search
CPC ............. H01L 27/1244; G02F 1/13452; G02F 1/136227; G02F 1/136286; G02F 1/1368
See application file for complete search history.

(56) References Cited

U.S. PATENT DOCUMENTS

| 10,564,502 B1 | 2/2020 | Nakagawa |
| 2007/0200965 A1 | 8/2007 | Okawa et al. |
| (Continued) | | |

FOREIGN PATENT DOCUMENTS

| CN | 1954253 A | 4/2007 |
| CN | 101487962 A | 7/2009 |
| (Continued) | | |

OTHER PUBLICATIONS

First Office Action for Application No. 202011035306.2 issued by the Chinese Patent office dated Dec. 23, 2022.

*Primary Examiner* — Edward J Glick
*Assistant Examiner* — David Y Chung
(74) *Attorney, Agent, or Firm* — IP & T Group LLP

(57) ABSTRACT

A display substrate includes: a base, a plurality of pixel units arranged in columns in a first direction and in rows in a second direction, a plurality of data lines and first gate lines extending in the first direction, a plurality of second gate lines extending in the second direction, and at least one gate driver circuit connected to the first gate lines and located at a side of the display substrate parallel to the second direction. One pixel unit includes a TFT. The TFT is connected to one data line. In a column of pixel units, TFTs of any two adjacent pixel units are respectively located at first and second sides of a respective data line. Each second gate line is connected to a row of pixel units and at least one of the first gate lines. First gate lines connecting different second gate lines are different.

20 Claims, 9 Drawing Sheets

(51) Int. Cl.
*G02F 1/1345* (2006.01)
*G02F 1/1362* (2006.01)

(52) U.S. Cl.
CPC .. *G02F 1/136227* (2013.01); *G02F 1/136286* (2013.01); *G02F 2201/122* (2013.01)

(56) References Cited

U.S. PATENT DOCUMENTS

| | | | |
|---|---|---|---|
| 2010/0066967 A1* | 3/2010 | Takahashi | G09G 3/20 349/151 |
| 2014/0043306 A1* | 2/2014 | Min | G09G 3/3677 345/204 |
| 2016/0093640 A1* | 3/2016 | Kawamura | H01L 27/124 257/72 |
| 2018/0108677 A1 | 4/2018 | Yeh | |
| 2018/0217431 A1 | 8/2018 | Baba et al. | |

FOREIGN PATENT DOCUMENTS

| | | |
|---|---|---|
| JP | 201072363 A | 4/2010 |
| KR | 10-2014-0141166 A | 12/2014 |
| TW | 202032238 A | 9/2020 |

* cited by examiner

DISPLAY SUBSTRATE AND DISPLAY APPARATUS

CROSS-REFERENCE TO RELATED APPLICATION

This application claims priority to Chinese Patent Application No. 202011035306.2, filed on Sep. 27, 2020, which is incorporated herein by reference in its entirety.

TECHNICAL FIELD

The present disclosure relates to the field of display technologies, and in particular, to a display substrate and a display apparatus.

BACKGROUND

With the development and progress of society, electronic display products are more and more widely used. A bezel with a small size enables a display apparatus to have a large screen-to-body ratio, which allows a user to obtain good visual experience.

SUMMARY

In an aspect, a display substrate is provided. The display substrate includes a base, and a plurality of pixel units, a plurality of data lines, a plurality of first gate lines, a plurality of second gate lines, and at least one gate driver circuit connected to the plurality of first gate lines, that are disposed on the base. The plurality of pixel units are arranged in columns in a first direction and in rows in a second direction, and a pixel unit includes a thin film transistor (TFT). The first direction intersects with the second direction. The plurality of data lines are arranged in the second direction and extend in the first direction. The TFT is connected to one data line. In a column of pixel units, TFTs of any two adjacent pixel units are respectively located on a first side and a second side of a respective data line. The first side and the second side are opposite sides of a same data line. The plurality of first gate lines are arranged in the second direction and extend in the first direction. The plurality of second gate lines are arranged in the first direction and extend in the second direction. Each second gate line is connected to a row of pixel units and at least one of the plurality of first gate lines. First gate lines connected to different second gate lines are different. The at least one gate driver circuit is located at a side of the display substrate parallel to the second direction.

In some embodiments, any two adjacent columns of pixel units have a gap therebetween, at least one data line is disposed in each gap, and one first gate line is disposed in each of at least part of gaps.

In some embodiments, the pixel unit further includes an electrode connected to the TFT. The electrode and the TFT are stacked in a direction perpendicular to a plane where the base is located, the TFT includes a first electrode, a second electrode, and a gate, and the plurality of second gate lines and the gate are disposed in the same layer. The display substrate further includes an organic film located between the electrode and the TFT, and the organic film has a plurality of via holes. The plurality of first gate lines are located between the organic film and the electrode, and each first gate line is connected to one second gate line through one of the plurality of via holes.

In some embodiments, an orthogonal projection of each first gate line on the base is located between orthogonal projections of two adjacent data lines on the base.

In some embodiments, the pixel unit further includes an electrode connected to the TFT, and the electrode and the TFT are stacked in a direction perpendicular to a plane where the base is located. The TFT includes a first electrode, a second electrode, and a gate. The plurality of first gate lines are disposed on a side of the TFT away from the base, and the plurality of second gate lines and the gate are disposed in the same layer. The display substrate further includes an interlayer insulating layer located between the electrode and the TFT, and the interlayer insulating layer has a plurality of via holes. Each first gate line is connected to one second gate line through one of the plurality of via holes.

In some embodiments, a distance between orthogonal projections, on the base, of a first gate line and a data line in the same gap is less than a width of the data line.

In some embodiments, the display substrate further includes a filling layer disposed in the via hole, and the filling layer and the electrode are disposed in the same layer.

In some embodiments, the pixel unit further includes an electrode connected to the TFT, and the electrode and the TFT are stacked in a direction perpendicular to a plane where the base is located. The TFT includes a first electrode, a second electrode, and a gate. The plurality of first gate lines and the first electrode are disposed in the same layer, and the plurality of second gate lines and the gate are disposed in the same layer. The display substrate further includes an interlayer insulating layer located between the electrode and the TFT. The interlayer insulating layer has a plurality of via holes, and each first gate line is connected to one second gate line through one of the plurality of via holes.

In some embodiments, the display substrate further includes a filling layer disposed in the via hole, and the filling layer and the electrode are disposed in the same layer.

In some embodiments, a distance between orthogonal projections, on the base, of a first gate line and a data line in the same gap is greater than a width of the data line.

In some embodiments, the pixel unit further includes a connection portion, an end of the connection portion is connected to a data line corresponding to the pixel unit, and another end of the connection portion is connected to the TFT. An orthogonal projection of each first gate line on the base is non-overlapping with an orthogonal projection of the connection portion on the base.

In some embodiments, the at least one data line disposed in the gap includes one data line. The first gate line includes a plurality of first extension portions and a plurality of second extension portions that are arranged alternately. Each first extension portion extends in the first direction, and each second extension portion extends in the second direction. Any two adjacent first extension portions are respectively located at opposite sides of a column of pixel units, and any two adjacent second extension portions are respectively located at opposite sides of a row of pixel units.

In some embodiments, in two data lines located at opposite sides of a column of pixel units, a TFT of any pixel unit is connected to one of the two data lines, and a first extension portion corresponding to the pixel unit and another of the two data lines are located in the same gap.

In some embodiments, the first gate line further includes a plurality of transition portions, and a first extension portion and a second extension portion that are adjacent are connected through one transition portion at a position where the TFT is located. There is a predetermined angle between the transition portion and the second direction.

In some embodiments, the pixel unit further includes an electrode connected to the TFT and a compensation electrode connected to the electrode. The compensation electrode is closer to the another data line, which is in the same gap as the first extension portion corresponding to the pixel unit, than the electrode, so that a coupling capacitance between the electrode and the compensation electrode as a whole and one of two data lines is equal to a coupling capacitance between the electrode and the compensation electrode as a whole and the another of the two data lines.

In some embodiments, the compensation electrode has a hollow-out pattern.

In some embodiments, the at least one data line disposed in the gap includes two data lines connected to each other. An orthogonal projection of the first gate line on the base is located between orthogonal projections of the two data lines connected to each other on the base.

In some embodiments, the orthogonal projections, on the base, of the two data lines connected to each other and the first gate line are arranged in parallel and at equal intervals.

In some embodiments, a width of the first gate line is greater than a width of the data line.

In another aspect, a display apparatus is provided. The display apparatus includes the display substrate as described in any of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products involved in the embodiments of the present disclosure.

DETAILED DESCRIPTION

Figure 1:
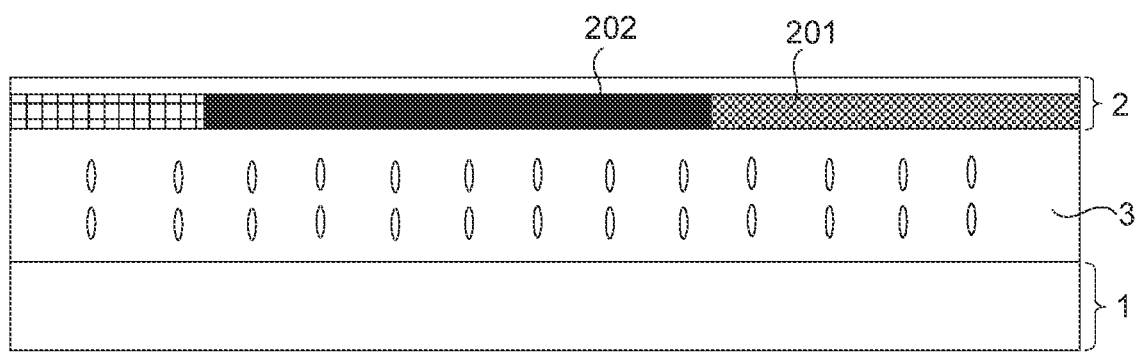
FIG. 1 is a schematic diagram illustrating a structure of a display apparatus, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first", "second" and the like are only used for descriptive purposes, and are not to be construed as indicating or implying relative importance or implicitly indicating the number of indicated technical features. Thus, a feature defined with "first", "second" or the like may explicitly or implicitly include one or more of the features. As used in this specification and the appended claims, the singular forms "a", "an" and "the" may also include plural referents unless the content clearly dictates otherwise. In the description of the embodiments of the present disclosure, the term "a plurality of," "the plurality of" or "multiple" means two or more unless otherwise specified.

In the description of some embodiments, the terms such as "coupled", "connected" and their derivatives may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about", "substantially" or "approximately" as used herein include a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to cross-sectional views and/or plan views as idealized exemplary drawings. In the accompanying drawings, thicknesses of layers and regions are enlarged for clarity. Exemplary embodiments of the present disclosure should not be construed as being limited to shapes of regions shown herein, but include deviations in shapes due to, for example, manufacturing. For example, an etched region that is shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus. The display apparatus may serve as any product or component having a display function, such as an electronic paper, a mobile phone, a tablet computer, a television, a display, a notebook computer, a digital frame, a navigator or a wearable device, which is not limited in the embodiments of the present disclosure.

In some embodiments, the display apparatus may be a liquid crystal display (LCD). For example, as shown in FIG. 1, the display apparatus 100 includes a display substrate 1 and an opposite substrate 2 opposite to each other, and a liquid crystal layer 3 disposed between the display substrate 1 and the opposite substrate 2.

For example, as shown in FIG. 1, in a case where the opposite substrate 2 includes color filter patterns 201 and black matrixes 202, the opposite substrate 2 may also be referred to as a color filter (CF) substrate.

Based on this, the display apparatus 100 may further include more or fewer components, such as a housing, a polarizer, a backlight assembly and other electronic accessories, and relative positions of these components may be changed.

Of course, the display apparatus 100 may also be an organic light-emitting diode (OLED) display, a quantum dot light-emitting diode (OLED) display or a micro light-emitting diode (Micro-LED) display, which is not limited in the embodiments of the present disclosure. For example, the display apparatus 100 includes a display substrate 1, a frame, a cover plate and other electronic accessories.

The technical solutions provided by the embodiments of the present disclosure will be described below by taking an example in which the display apparatus 100 is an LCD.

Some embodiments of the present disclosure provide a display substrate 1, which may be applied to the display apparatus 100 described above.

Figure 2:
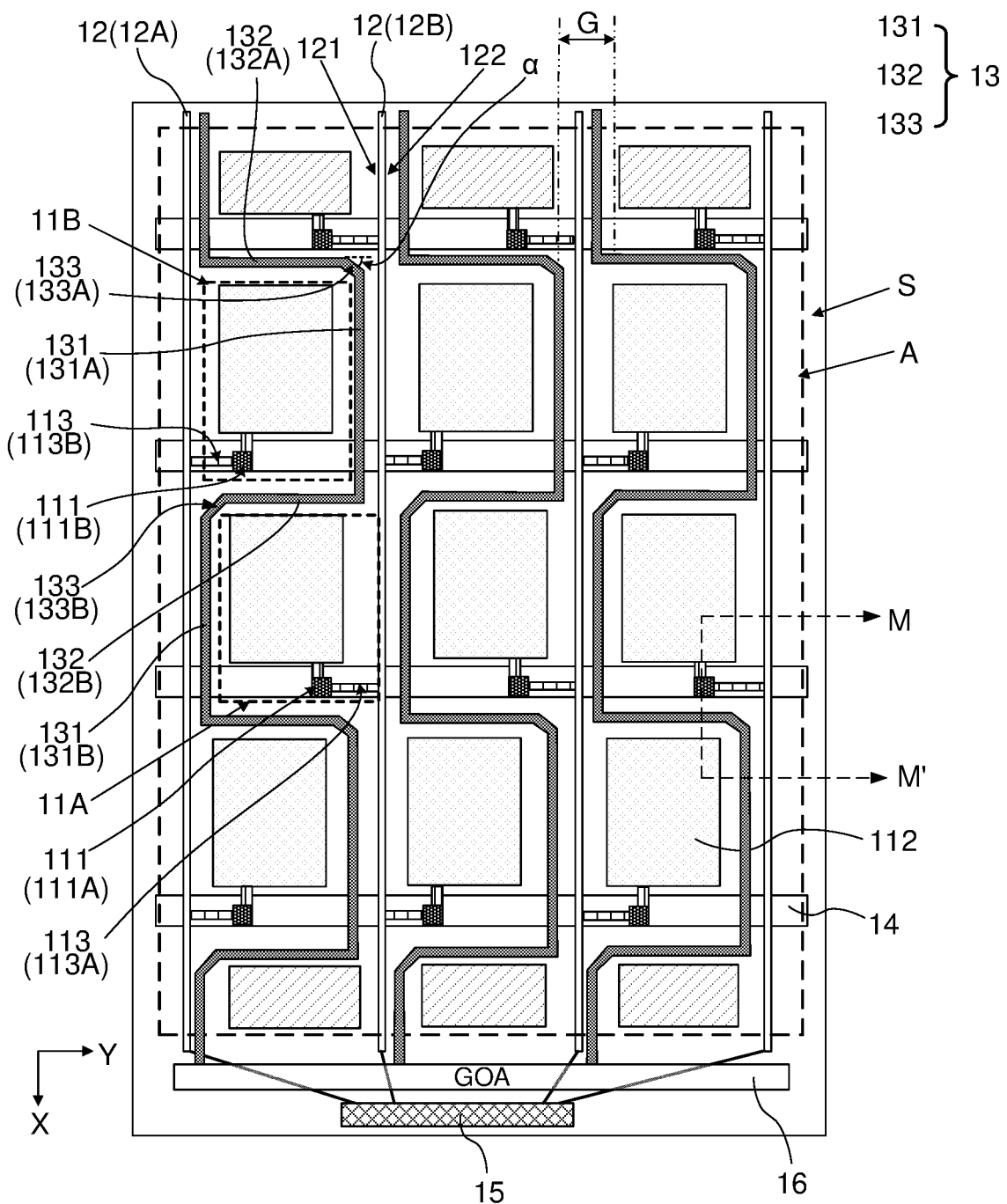
FIG. 2 is a schematic diagram illustrating a structure of a display substrate, in accordance with some embodiments.

As shown in FIG. 2, the display substrate 1 has a display area A and a peripheral area S. According to different designs of the display substrate 1, a position of the peripheral area S may be changed accordingly. For example, as shown in FIG. 2, the peripheral area S surrounds the display area A. As another example, the peripheral area S is located at one or more sides of the display area A, but does not surround the display area A. The display substrate 1 includes a base 10, and a plurality of pixel units 11, a plurality of data lines 12, a plurality of first gate lines 13, a plurality of second gate lines 14, and at least one gate driver circuit 16 connected to the plurality of first gate lines 13, that are disposed on the base 10.

As shown in FIG. 2, the plurality of pixel units 11 are located in the display area A, and include a plurality of first color pixel units, a plurality of second color pixel units, and a plurality of third color pixel units. A first color, a second color, and a third color are three primary colors (e.g., red, green, and blue). The first color pixel units, the second color pixel units, and the third color pixel units are configured to emit light of the three primary colors.

For convenience of description, the embodiments of the present disclosure are described by taking an example in which the plurality of pixel units 11 are arranged in an array. In this case, as shown in FIG. 2, pixel units 11 arranged in a line in a first direction X are referred to as pixel units 11 in the same column, and pixel units 11 arranged in a line in a second direction Y are referred to as pixel units 11 in the same row. The first direction X intersects with the second direction Y. For example, as shown in FIG. 2, the first direction X intersects the second direction Y perpendicularly.

One of the plurality of pixel units 11 includes a thin film transistor (TFT). For example, as shown in FIG. 2, each pixel unit 11 includes a TFT 111. The TFT 111 is configured to drive the pixel unit 11 to emit light, so that the display substrate 1 displays an image.

As shown in FIG. 2, the plurality of data lines 12 are arranged in the second direction Y, and each data line 12 extends substantially in the first direction X. The TFT 111 of each pixel unit 11 is connected to one data line 12. Furthermore, in the same column of pixel units 11, the TFTs 111 of any two adjacent pixel units 11 are connected to different data lines 12 respectively. As shown in FIG. 2, in the same column of pixel units 11, the TFTs 111 of any two adjacent pixel units 11 are respectively located at a first side 121 and a second side 122 of a respective data line 12. The first side 121 and the second side 122 are two opposite sides of the same data line 12.

It will be understood that, since the data line 12 is a signal line extending in the first direction X, "the first side 121 and the second side 122 of the same data line 12" mentioned in the embodiments of the present disclosure are two opposite sides of the same data line 12 in the second direction Y, that is, a direction from the first side 121 to the second side 122 is parallel to the second direction Y. For example, the first side 121 and the second side 122 of the data line 12 are the left side and right side of the data line 12 respectively as shown in FIG. 2.

For example, as shown in FIG. 2, in two adjacent pixel units 11A and 11B in the same column of pixel units 11, the TFT 111B of the pixel unit 11B is connected to the data line 12A, and the TFT 111B is located at the second side 122 of the data line 12A (i.e., the right side of the data line 12A); and the TFT 111A of the pixel unit 11A is connected to the data line 12B, and the TFT 111A is located at the first side 121 of the data line 12B (i.e., the left side of the data line 12B).

In this way, the plurality of data lines 12 are connected to a circuit structure (i.e., a source driver integrate circuit (IC) 15) in the peripheral area S of the display substrate 1 to receive corresponding data voltages and transmit different data voltages to TFTs 111 of different pixel units 11, so that data voltages received on any two adjacent pixel units 11 in the same column come from two different data lines 12, and in turn a data voltage from one data line 12 (e.g., the data line 12B) can drive pixel units 11 that are in two columns of pixel units 11 located at the first side 121 and the second side 122 of the data line 12, connected to the data line 12 and disposed at intervals to emit light. For example, as shown in FIG. 2, there is one source driver IC 15. Of course, there may be many source driver ICs 15, which is not limited in the embodiments of the present disclosure.

Generally, a driving method of the LCD apparatus is alternating current (AC) driving, that is, driving voltages of adjacent pixel units maintain opposite polarities. Since the same data line 12 is alternately connected to pixel units 11 in different columns at opposite sides thereof, when a voltage polarity on the data line 12 changes, for example, from a positive voltage to a negative voltage or from a negative voltage to a positive voltage, a voltage polarity of the data voltage received by the pixel unit 11 connected to the data line 12 changes. In this way, the LCD apparatus may have the same or similar image display quality as an LCD apparatus using a dot inversion method, and have low power consumption similar to that of an LCD apparatus using a row inversion method or a column inversion method at the time of polarity inversion.

As shown in FIG. 2, the plurality of first gate lines 13 are arranged in the second direction Y, and each first gate line 13 extends substantially in the first direction X. The plurality of second gate lines 14 are arranged in the first direction X, and each second gate line 14 extends substantially in the second direction Y. Each second gate line 14 is connected to a row of pixel units 11 and at least one of the plurality of first gate lines 13. First gate lines 13 connected to different second gate lines 14 are different. In this way, the first gate lines 13 are electrically connected to a circuit structure (i.e., the gate driver circuit 16) located in the peripheral area S of the display substrate 1 to receive a corresponding scan voltage and transmit the received scan voltage to a row of pixel units 11 through the second gate line 14, so that the row of pixel units 11 controls the TFTs 111 thereof to be turned on or off according to the received scan signal.

The at least one gate driver circuit 16 is located at a side of the peripheral area S of the display substrate 1 parallel to the second direction Y. For example, as shown in FIG. 2, the at least one gate driver circuit 16 is located at a bottom side of the display apparatus 1.

In some examples, as shown in FIG. 2, there is one gate driver circuit 16, that is, a gate driving mode of the display apparatus 100 is single-side driving.

Figure 11:
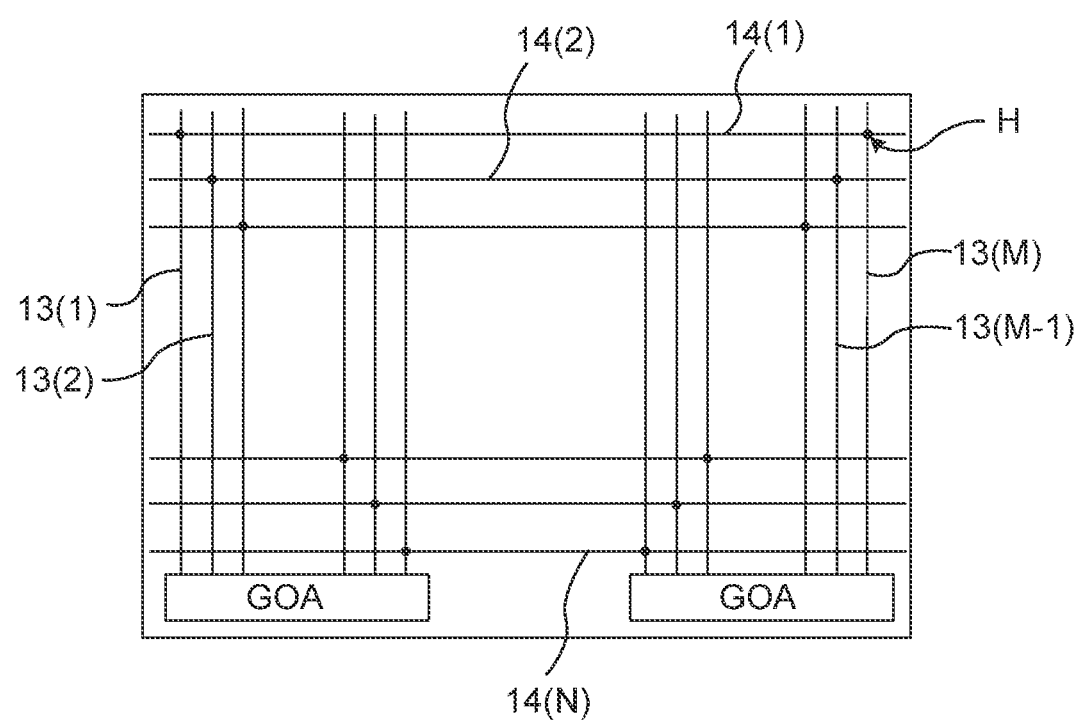
FIG. 11 is a schematic diagram illustrating a connection relationship between first gate lines and second gate lines in a display substrate, in accordance with some embodiments.

In some other examples, as shown in FIG. 11, there are two gate driver circuits 16, that is, the gate driving mode of the display apparatus 100 is double-side driving.

In an example in which the gate driving mode is double-side driving, the two gate driver circuits 16 are disposed at the bottom side of the display apparatus 1. In this way, compared with a case where the gate driver circuits 16 are located at two sides (i.e., the left and right sides of the display substrate 1) of the peripheral area S of the display substrate 1 parallel to the first direction X, that the gate driver circuits 16 are located at only one side of the display substrate 1 may effectively reduce an area occupied by the gate driver circuits 16 in the peripheral area S of the display substrate 1, so that zero bezels of remaining sides of the display apparatus 100 may be achieved. In an example in which the display apparatus 100 has four sides, the gate driver circuits 16 are disposed at the bottom side of the display apparatus 1, so that zero bezels of the remaining three sides of the display apparatus 100 may be achieved (for example, a width of each side is only 0.9 mm, which is negligible), and full-screen display is achieved.

In some embodiments, any two adjacent columns of pixel units 11 have a gap therebetween, at least one data line 12 is disposed in each gap, and one first gate line 13 is disposed in each of some gaps.

In some examples, as shown in FIG. 2, one data line 12 is disposed in each gap G. Of course, a plurality of data lines 12, for example, two data lines 12 shown in FIG. 8, may be disposed in each gap G, which is not limited in the embodiments of the disclosure.

In the embodiments of the present disclosure, the number of the first gate lines 13 may be set according to the numbers of rows and columns of the pixel units 11 and the gate driving mode.

For example, in a case where the gate driving mode is the single-side driving, and the numbers of rows and columns of pixel units 11 are equal, one first gate line 13 is disposed in each gap G.

As another example, in a case where the gate driving mode is the double-side driving, and the number of rows of pixel units 11 is less than twice the number of columns of pixel units 11, one first gate line 13 is disposed in each of some gaps G. For example, the display apparatus 100 has 4,320 rows of pixel units and 23,040 (i.e., 7,680 times 3) columns of pixel units 11, if the gate driving mode is double-side driving, there is a need to provide 8,640 (i.e., 4,320 times 2) first gate lines 13 for the display apparatus 100. However, pixel units 11 in different columns have 23,039 (i.e., 7,680×3−1) gaps therebetween, so that one first gate line 13 needs to be disposed only in each of some gaps G.

In some examples, the display substrate 1 includes two gate driver circuits 161 and 162, and in this case, each second gate line 14 is connected to two first gate lines 13. For example, as shown in FIG. 11, the plurality of second gate lines 14 are arranged in rows in the first direction X, and are referred to as a first row of second gate lines 14(1), a second row of second gate lines 14(2) until an N-th row of second gate lines 14(N) from top to bottom. The plurality of first gate lines 13 are arranged in columns in the second direction Y, and are referred to as a first column of first gate lines 13(1), a second column of first gate lines 13(2) until an M-th column of first gate lines 13(M) from left to right. The first row of second gate line 14(1) is connected to the first column of first gate line 13(1) and the M-th column of first gate line 13(M), the second row of second gate line 14(2) is connected to the second column of first gate line 13(1) and the (M−1)-th column of first gate line 13(M−1), and so on, until the N-th row of second gate line 14(N) is connected to two first gate lines 13. In this way, via holes connecting the first gate lines 13 and the second gate lines 14 are distributed in a V-shape on the base 10, so that partial poor display quality may be avoided, and a good display effect may be obtained.

In a case where one first gate line 13 is disposed in each of some gaps G, the first gate lines 13 are uniformly distributed on the display substrate 1. Thus, a good display effect may be obtained.

In some examples, materials of the first gate lines 13, the second gate lines 14, and the data lines 12 may include metal having a high conductivity and a low resistivity relative to a transparent conductive material, so that a signal amount of the signal lines may be effectively increased, in turn the power consumption of the display substrate 1 is reduced.

In some examples, since a scan voltage applied to the first gate line 13 is generally higher than the data voltage applied to the data line 12, a width of the first gate line 13 may be greater than a width of the data line 12.

For example, the data line 12 is made of copper, and the width of the data line 12 may be in a range of 5 μm to 7 μm, inclusive, such as 6 μm.

For example, the first gate line 13 is made of copper, and the width of the first gate line 13 may be in a range of 6 μm to 9 μm, inclusive, such as 7 μm.

For example, a thickness of the first gate line 13 may be in a range of 0.4 μm to 0.6 μm, inclusive.

For example, a thickness of the data line 12 may be in a range of 0.4 μm to 0.6 μm, inclusive.

In the embodiments of the present disclosure, there are various arrangements regarding a position relationship between the first gate line 13 and the data line 12 in the display substrate 1. The embodiments of the present disclosure are schematically illustrated by taking the following three implementations as examples.

Figure 3:
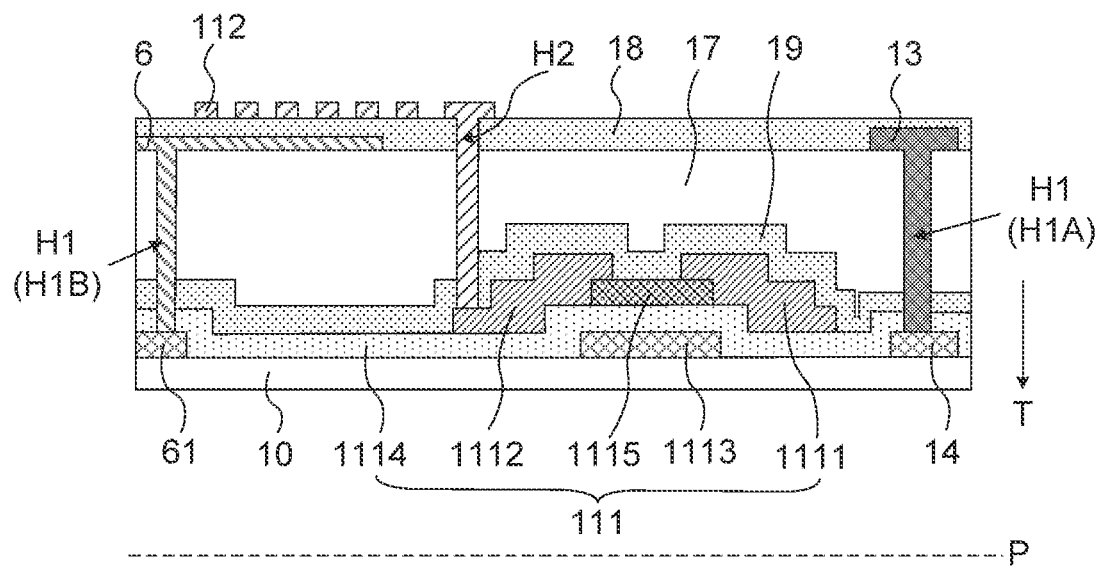
FIG. 3 is a sectional view of the display substrate in FIG. 2 taken along the line M-M'.

In a first possible implementation, as shown in FIG. 2, each pixel unit 11 further includes an electrode 112 connected to the TFT 111. As shown in FIG. 3, the TFT 111 includes a gate 1113 located on the base 10, a gate insulating layer 1114 located on a side of the gate 1113 away from the base 10, an active layer 1115 located on a side of the gate insulating layer 1114 away from the base 10, and a first electrode 1111 and a second electrode 1112 located on a side of the active layer 1115 away from the base 10. The first electrode 1111 and the second electrode 1112 are disposed in the same layer.

In addition, for example, the first electrode 1111 (or the second electrode 1112) of the TFT 111 is connected to the data line 12, and both of the first electrode 1111 (or the second electrode 1112) and the data line 12 are disposed in the same layer (not shown in the figures). The gate 1113 of the TFT 111 may be connected to the second gate line 14 (not shown in the figures), and both of the gate 1113 and the second gate line 14 are disposed in the same layer.

The electrode 112 and the TFT 111 are stacked in a direction T perpendicular to a plane where the base 10 is located. That is, the electrode 112 is located on a side of the TFT 111 away from the base 10, and the second electrode 1112 (or the first electrode 1111) of the TFT 111 is connected to the electrode 112.

Figure 4:
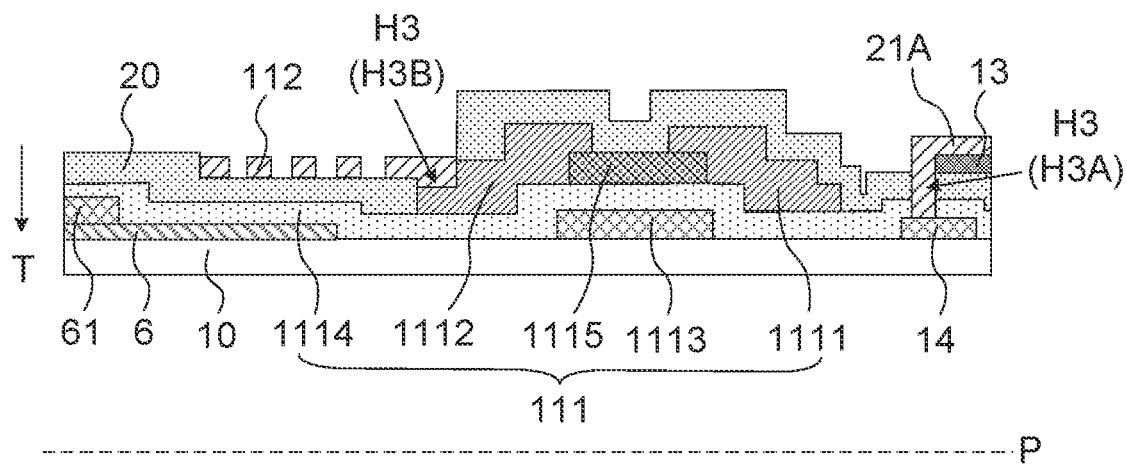
FIG. 4 is another sectional view of the display substrate in FIG. 2 taken along the line M-M'.
Figure 5:
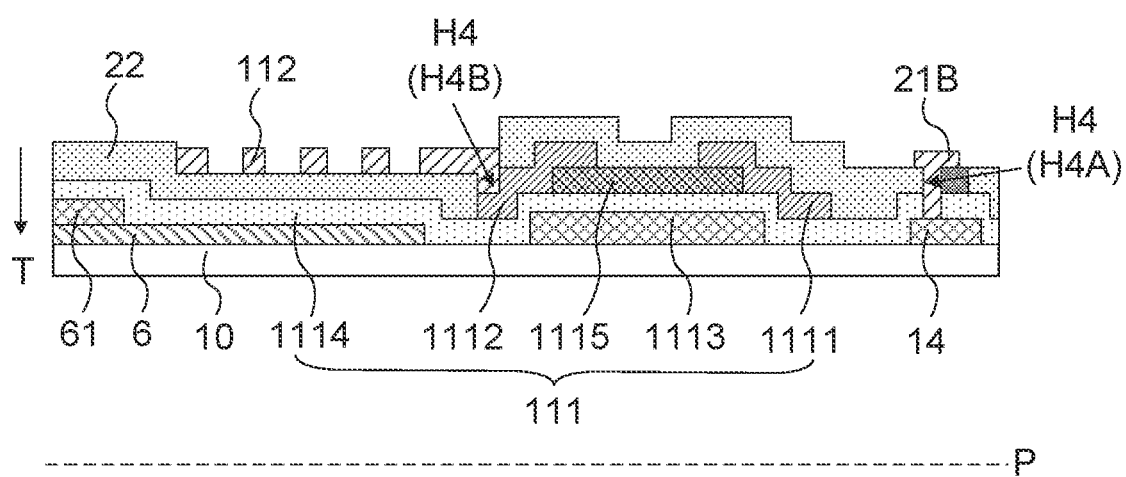
FIG. 5 is yet another sectional view of the display substrate in FIG. 2 taken along the line M-M'.

It will be understood that, as shown in FIGS. 3 to 5, the direction T perpendicular to the plane P where the base 10 is located is a direction parallel to a thickness of the base 10.

As shown in FIG. 3, the display substrate 1 further includes an organic film 17 located between the electrode 112 and the TFT 111. The electrode 112 is located on a side of the organic film 17 away from the base 10, and the first gate 13 is located between the organic film 17 and the electrode 112. That is, the first gate line 13 and the data line 12 are disposed in different layers. In this way, a short-circuit between the first gate line 13 and the data line 12 may be avoided. Based on this, as shown in FIG. 3, the display substrate 1 further includes an interlayer insulating layer 18 located between the electrode 112 and the first gate line 13.

In the first implementation, in order to distinguish different interlayer insulating layers, the interlayer insulating layer 18 located between the electrode 112 and the first gate line 13 is referred to as a first interlayer insulating layer 18.

The organic film 17 and the first interlayer insulating layer 18 are provided with a plurality of via holes respectively. In the embodiments of the present disclosure, in order to distinguish via holes in different layers, the via holes in the organic film 17 are referred to as first via holes H1, and the via holes in the first interlayer insulating layer 18 are referred to as second via holes H2. As shown in FIG. 3, the first gate line 13 is connected to the second gate line 14 through one first via hole H1A, and the electrode 112 is connected to the second electrode 1112 of the TFT 111 through one second via hole H2.

Herein, it will be understood that, the first via hole H1A connecting the first gate line 13 and the second gate line 14 further penetrates the gate insulating layer 1114, and the second via hole H2 connecting the electrode 112 and the second electrode 1112 of the TFT 111 further penetrates the organic film 17.

Thus, the first gate line 13 may transmit the received scan signal to the gate 1113 of the TFT 111 through the second gate line 14, so that the TFT 111 is turned on or off. In a case where the TFT 111 is turned on, the data line 12 may transmit the received data signal to the second electrode 1112 of the TFT 111 through the first electrode 1111 of the TFT 111, and the data signal may be transmitted to the electrode 112 through the second electrode 1112.

In this way, in the same gap G, a distance between the first gate line 13 and the data line 12 in the direction T perpendicular to the plane P where the base 10 is located is determined by a thickness of the organic film 17. Providing the organic film 17 may increase distances between the first gate line 13 and the TFT 111, the first gate line 13 and the second gate line 14, and the first gate line 13 and the data line 12 in the direction T perpendicular to the plane P where the base 10 is located, so that a distance between an orthogonal projection of the first gate line 13 on the base 10 and an orthogonal projection of the data line 12 on the base 10 is shortened, and in turn an aperture ratio of the pixel unit 11 of the display substrate 1 may be increased.

In the embodiments of the present disclosure, the first electrode is one of a source and a drain of the TFT, and the second electrode is another of the source and the drain of the TFT. Since the source and the drain of the transistor may be symmetrical in structure, there may be no difference in structure between the source and the drain of the transistor. That is, there may be no difference in structure between the first electrode and the second electrode of the TFT in the embodiments of the present disclosure. For example, for a P-type TFT, the second electrode is referred to as the drain, and the first electrode is referred to as the source. As another example, for an N-type TFT, the first electrode is referred to as the drain, and the second electrode is referred to as the source.

In the embodiments of the present disclosure, the term "same layer" refers to a layer structure formed through a same patterning process by using a same mask in which a film layer for forming a specific pattern is formed by using a same film-forming process. Depending on different specific patterns, the same patterning process may include exposure, development and etching, and the specific patterns formed in the layer structure may be continuous or discontinuous, and these specific patterns may also be at different heights or have different thicknesses.

In some examples, each first gate line 1 extends in the first direction X between two adjacent data lines 2, and an orthogonal projection of each first gate line 1 on the base 10 is located between orthogonal projections of two adjacent data lines 2 on the base 10. Thus, a coupling capacitance between the first gate line 13 and the data line 12 in the same gap G is small, and the scan voltage on the first gate line 13 and the data voltage on the data line 12 do not affect each other, which facilitates normal display of the display apparatus 100.

In some examples, the distance between the orthogonal projection of the first gate line 13 on the base 10 and the orthogonal projection of the data line 12 in the same gap G on the base 10 is less than the width of the data line 12. In this way, it is possible to increase the aperture ratio of the pixel unit 11 of the display substrate 1 and an effective display area of the display substrate 1.

For example, the distance between the orthogonal projection of the first gate line 13 on the base 10 and the orthogonal projection of the data line 12 in the same gap G on the base 10 is in a range of 3 µm to 6 µm, inclusive.

In the embodiments of the present disclosure, the distance between the orthogonal projections, on the base 10, of the first gate line 13 and the data line 12 in the same gap G is inversely proportional to a distance between the first gate line 13 and the data line 12 in the direction T perpendicular to the plane where the base 10 is located. That is, the larger the distance between the first gate line 13 and the data line 12 in the direction T perpendicular to the plane where the base 10 is located, the smaller the distance between the orthogonal projections of the first gate line 13 and the data line 12 on the base 10. In some examples, as shown in FIG. 3, the display substrate 1 further includes an interlayer insulating layer 19 located between the TFT 111 and the organic film 17.

In the first implementation, in order to distinguish different interlayer insulating layers, the interlayer insulating layer 19 located between the TFT 111 and the organic film 17 is referred to as a second interlayer insulating layer 19.

For example, the second interlayer insulating layer 19 is made of silicon nitride. Silicon nitride has good compactness and may prevent impurity ions in the organic film 17 from diffusing downwards into the TFT 111, thereby improving a stability of the TFT 111.

Based on this, it will be understood that, the first via hole H1A and the second via hole H2 both further penetrate the second interlayer insulating layer 19.

In some embodiments, the display apparatus 100 is an LCD, and the electrode 112 is a pixel electrode. Based on this, the display substrate 1 further includes a common electrode signal line and a common electrode located in each pixel unit 11 on the base 10. For example, as shown in FIG. 3, the common electrode signal line 61 and the second gate line 14 are disposed in the same layer, the common electrode 6 is located on a side of the organic film 17 away from the TFT 111, and an orthogonal projection of the common electrode 6 on the base 10 overlaps with an orthogonal projection of the pixel electrode on the base 10. For example, the common electrode 6 and the first gate line 13 are disposed in the same layer.

As shown in FIG. 3, the common electrode signal line 61 is connected to the common electrode 6 through one first via hole H1B, and is configured to transmit a common voltage to the common electrode 6. In this way, the pixel electrode (i.e., the electrode 112) and the common electrode 6 in each pixel unit 11 may form an electric field. Since the liquid crystal has a characteristic of dielectric anisotropy, the liquid crystal molecules in the pixel unit may rotate due to the action of the electric field, so as to control the amount of light emitted by the pixel unit, thereby enabling the LCD to display a corresponding image. Herein, it will be understood that, the first via hole H1B connecting the common electrode signal line 61 and the common electrode 6 further penetrates the second interlayer insulating layer 19 and the gate insulating layer 1114.

For example, the electrode 112 may be made of a transparent conductive material, such as indium tin oxid (ITO).

For example, the common electrode 6 may also be made of the transparent conductive material, such as indium tin oxid (ITO).

For example, the organic film may be made of a transparent organic material, such as epoxy resin.

For example, as shown in FIG. 3, the pixel electrode is in a shape of a strip. Of course, the pixel electrode may also be in a shape of a block or in other shapes. For example, as shown in FIG. 3, the common electrode 6 is plate-shaped. Of course, the common electrode may also be in other shapes.

Herein, it will be understood that, in a case where the pixel electrode is in the shape of a strip, the electrode 112 in each pixel unit 11 described in the embodiments of the present disclosure includes a plurality of strip-shaped pixel electrodes arranged at intervals.

For example, a thickness of the electrode 112 is in a range of 1 µm to 2 µm, inclusive.

The shapes of the pixel electrode and the common electrode are not limited in the embodiments of the present disclosure, and the shapes and a relative position relationship of the pixel electrode and the common electrode may be reasonably set according to a display mode of the liquid crystal in the display apparatus 100. For example, in a case where the display mode of the liquid crystal is a fringe field switching (FFS) or an advanced super dimension switch (ADS) display mode, the pixel electrode is in the shape of the strip as shown in FIG. 3, and the common electrode 6 is plate-shaped as shown in FIG. 3. As another example, in a case where the display mode of the liquid crystal is an in-plane switch (IPS) display mode, both the pixel electrode and the common electrode 6 are comb-shaped and arranged crosswise. As another example, in a case where the display mode of the liquid crystal is a twisted nemaic (TN) or a vertical alignment (VA) display mode, the common electrode 6 may be located on the CF substrate opposite to the display substrate 1 in the LCD, and the liquid crystal layer 3 is sandwiched between the common electrode 6 and the electrode 112.

In a second possible implementation, as shown in FIG. 2, each pixel unit 11 further includes an electrode 112 connected to the TFT 111. As shown in FIG. 4, the TFT 111 includes a gate 1113 located on the base 10, a gate insulating layer 1114 located on a side of the gate 1113 away from the base 10, an active layer 1115 located on a side of the gate insulating layer 1114 away from the base 10, and a first electrode 111 and a second electrode 112 located on a side of the active layer 1115 away from the base 10. The first electrode 1111 and the second electrode 1112 are disposed in the same layer.

In addition, for example, the first electrode 1111 (or the second electrode 1112) of the TFT 111 is connected to the data line 12, and the first electrode 1111 (or the second electrode 1112) and the data line 12 are disposed in the same layer (not shown in the figures). The gate 1113 of the TFT 111 may be connected to the second gate line 14 (not shown in the figures), and both of the gate 1113 and the second gate line 14 are disposed in the same layer.

The electrode 112 and the TFT 111 are stacked in a direction T perpendicular to a plane where the base 10 is located. That is, the electrode 112 is located on a side of the TFT 111 away from the base 10, and the second electrode 1112 (or the first electrode 1111) of the TFT 111 is connected to the electrode 112.

Base on this, as shown in FIG. 4, in the direction T perpendicular to the plane where the base 10 is located, the display substrate 1 further includes an interlayer insulating layer 20 located between the TFT 111 and the electrode 112.

In the embodiments of the present disclosure, in order to distinguish different interlayer insulating layers, the interlayer insulating layer 20 in the second implementation is referred to as a third interlayer insulating layer 20.

The first gate line 13 is located on a side of the third interlayer insulating layer 20 away from the TFT 111, that is, the first gate line 13 and the data line 12 are disposed in different layers. In this way, a short-circuit between the first gate line 13 and the data line 12 may be avoided. Thus, in the same gap G, a distance between the first gate line 13 and the data line 12 (i.e., a distance between the first gate line 13 and the first electrode 1111 of the TFT 111) in the direction T perpendicular to the plane where the base 10 is located is determined by a thickness of the third interlayer insulating layer 20.

The third interlayer insulating layer 20 is provided with a plurality of via holes. In the embodiments of the present disclosure, in order to distinguish via holes in different layers, the via holes in the third interlayer insulating layer 20 are referred to as third via holes H3. As shown in FIG. 4, the first gate line 13 is connected to the second gate line 14 through one third via hole H3A, and the electrode 112 is connected to the second electrode 1112 of the TFT 111 through another third via hole H3B. Based on this, in some examples, as shown in FIG. 4, the display substrate 1 further includes a filling layer 21A in the third via hole H3A connecting the first gate line 13 and the second gate line 14. The filling layer 21A and the electrode 112 are disposed in the same layer. That is, a material of the filling layer 21A may be the same as a material of the electrode 112, such as ITO. In this way, the filling layer 21A may be formed while the electrode 112 is formed to fill the third via hole H3, so that a connection between the first gate line 13 and the second gate line 14 is achieved, and a manufacturing process is simplified.

In some examples, the orthogonal projection of each first gate line 13 on the base 10 is located between the orthogonal projections of two adjacent data lines 12 on the base 10.

In some examples, the distance between the orthogonal projection of the first gate line 13 on the base 10 and the orthogonal projection of the data line 12 in the same gap G on the base 10 is less than the width of the data line 12. For example, the distance between the orthogonal projection of the first gate line 13 on the base 10 and the orthogonal projection of the data line 12 in the same gap G on the base 10 is in a range of 3 µm to 6 µm, inclusive.

In the embodiments of the present disclosure, the distance between the orthogonal projections, on the base 10, of the first gate line 13 and the data line 12 in the same gap G is inversely proportional to the distance between the first gate line 13 and the data line 12 in the direction T perpendicular to the plane where the base 10 is located. That is, the larger the distance between the first gate line 13 and the data line 12 in the direction T perpendicular to the plane where the base 10 is located, the smaller the distance between the orthogonal projections of the first gate line 13 and the data line 12 on the base 10.

In some embodiments, the display apparatus 100 is an LCD, and the electrode 112 is a pixel electrode. Based on this, the display substrate 1 further includes a common electrode signal line and a common electrode located in each pixel unit 11 on the base 10. As shown in FIG. 4, the common electrode signal line 61 and the second gate line 14 are disposed in the same layer, the common electrode 6 is located between the common electrode signal line 61 and the base 10, and an orthogonal projection of the common electrode 6 on the base 10 overlaps with an orthogonal projection of the pixel electrode on the base 10.

In the second implementation, a material and a shape of the pixel electrode, a material and a shape of the common electrode, and a relative position of the pixel electrode and the common electrode may refer to those in the first implementation, and will not be repeated herein.

In a third possible implementation, as shown in FIG. 2, each pixel unit 11 further includes an electrode 112 connected to the TFT 111. As shown in FIG. 5, the TFT 111 includes a gate 1113 located on the base 10, a gate insulating layer 1114 located on a side of the gate 1113 away from the base 10, an active layer 1115 located on a side of the gate insulating layer 1114 away from the base 10, and a first electrode 111 and a second electrode 112 located on a side of the active layer 1115 away from the base 10. The first electrode 1111 and the second electrode 1112 are disposed in the same layer.

In addition, for example, the first electrode 1111 (or the second electrode 1112) of the TFT 111 is connected to the data line 12, and the first electrode 1111 (or the second electrode 1112) and the data line 12 are disposed in the same layer (not shown in the figures). The gate 1113 of the TFT 111 may be connected to the second gate line 14 (not shown in the figures), and both of the gate 1113 and the second gate line 14 are disposed in the same layer.

The electrode 112 and the TFT 111 are stacked in a direction T perpendicular to a plane P where the base 10 is located. That is, the electrode 112 is located on a side of the TFT 111 away from the base 10, and the second electrode 1112 (or the first electrode 1111) of the TFT 111 is connected to the electrode 112.

Base on this, as shown in FIG. 5, in the direction T perpendicular to the plane where the base 10 is located, the display substrate 1 further includes an interlayer insulating layer 22 located between the TFT 111 and the electrode 112.

In the embodiments of the present disclosure, in order to distinguish different interlayer insulating layers, the interlayer insulating layer 22 in the third implementation is referred to as a fourth interlayer insulating layer 22.

As shown in FIG. 5, the first gate line 13 and the second electrode 1112 of the TFT 111 are disposed in the same layer. That is, the first gate line 13 and the data line 12 are disposed in the same layer.

Based on this, in order to avoid a short-circuit between the first gate line 13 and the data line 12, in some examples, the distance between the orthogonal projections of the first gate line 13 and the data line 12 on the base 10 is greater than the width of the data line 12. For example, the distance may be in a range of 6 µm to 10 µm, inclusive.

The fourth interlayer insulating layer 22 is provided with a plurality of via holes. In the embodiments of the present disclosure, in order to distinguish via holes in different layers, the via holes in the fourth interlayer insulating layer 22 are referred to as fourth via holes H4. As shown in FIG. 5, the first gate line 13 is connected to the second gate line 14 through one fourth via hole H4A, and the electrode 112 is connected to the second electrode 1112 of the TFT 111 through another fourth via hole H4B.

Herein, it will be understood that, the fourth via hole H4A connecting the first gate line 13 and the second gate line 14 further penetrates the gate insulating layer 1114.

Based on this, in some examples, the display substrate 1 further includes a filling layer 21B in the fourth via hole H4A connecting the first gate line 13 and the second gate line 14. The filling layer 21B and the electrode 112 are disposed in the same layer. That is, a material of the filling layer 21B may be the same as the material of the electrode 112, such as ITO. In this way, the manufacturing process may be simplified.

In some embodiments, as shown in FIG. 2, each pixel unit 11 further includes a connection portion 113. An end of the connection portion 113 is connected to the data line 12 connected to the TFT 111 of the pixel unit 11, and the other end of the connection portion 113 is connected to the TFT 111.

For example, as shown in FIG. 2, the TFT 111A in the pixel unit 11A is connected to the data line 12B. An end of the connection portion 113A in the pixel unit 11A is connected to the data line 12B, and the other end of the connection portion 113A is connected to the TFT 111A. As another example, the TFT 111B in the pixel unit 11B is connected to the data line 12A. An end of the connection portion 113B in the pixel unit 11B is connected to the data line 12A, and the other end of the connection portion 113B is connected to the TFT 111B.

As shown in FIG. 2, orthogonal projections of the first gate lines 13 on the base do not overlap with orthogonal projections of the connection portions 113 on the base 10.

In some embodiments, as shown in FIG. 2, one data line 12 is disposed in a gap G between adjacent columns of pixel units 11. In this case, the first gate line 13 includes a plurality of first extension portions 131 and a plurality of second extension portions 132 arranged alternately. Each first extension portion 131 extends in the first direction X, and each second extension portion 132 extends in the second direction Y. Moreover, any two adjacent first extension portions 131 in the same first gate line 13 are respectively located at two opposite sides of a column of pixel units 11, and any two adjacent second extension portions 132 are respectively located at two opposite sides of a row of pixel units 11.

Herein, it will be understood that, since a column of pixel units 11 includes a plurality of pixel units 11 therein, a length of the column of pixel units in the first direction X is much greater than a width of the column of pixel units in the second direction Y. Therefore, the term "two opposite sides of a column of pixel units 11" may be understood as the left side and the right side as shown in FIG. 2. That is, a direction from one side of a column of pixel units 11 to the other side thereof is parallel to the second direction Y. Similarly, the term "two opposite sides of a row of pixel units 11" may be understood as an upper side and a bottom side as shown in FIG. 2. That is, a direction from one side of a row of pixel units 11 to the other side thereof is parallel to the first direction X.

In the embodiments of the present disclosure, an orthogonal projection of any first extension portion 131 of the first gate line 13 on the base 10 does not overlap with the orthogonal projection of the data line 12 on the base 10, so that a parasitic capacitance generated between the data line 12 and the first gate line 13 may be effectively reduced.

In addition, orthogonal projections of the first extension portions 131 and the second extension portions 132 of the first gate line 13 on the base 10 do not overlap with the orthogonal projection of the connection portion 113 in any pixel unit 11 on the base 10. In this way, parasitic capacitances generated between the first gate line 13 and the TFTs 111 may be effectively reduced, and the display effect of the display apparatus 100 is improved.

In some examples, as shown in FIG. 2, in two data lines 12 located at two opposite sides of a column of pixel units 11, the TFT 111 of any pixel unit 11 is connected to one of the two data lines 12, and the first extension portion 131 of the first gate line 13 corresponding to the pixel unit 11 and the other of the two data lines 12 are located in the same gap G. In this way, it is possible to further ensure that the orthogonal projection of the first gate line 13 on the base 10 does not overlap with the orthogonal projections of the TFTs 111 on the base 10, thereby effectively reducing the parasitic capacitances generated between the first gate line 13 and the TFTs 111.

For example, as shown in FIG. 2, in two data lines 12A and 12B located at two opposite sides of a column of pixel units 11, the TFT 111A of the pixel unit 11A is connected to the data line 12B, and the first extension portion 131A of the first gate line 13 corresponding to the pixel unit 11A in the second direction Y and the data line 12A are located in the same gap G.

As another example, as shown in FIG. 2, in two data lines 12A and 12B located at two opposite sides of a column of pixel units 11, the TFT 111B of the pixel unit 11B is connected to the data line 12A, and the first extension portion 131B of the first gate line 13 corresponding to the pixel unit 11B in the second direction Y and the data line 12B are located in the same gap G.

In some examples, as shown in FIG. 2, the first gate line 13 further includes a plurality of transition portions 133. At a position where the TFT 111 is located, the first extension portion 131 and the second extension portion 132 that are adjacent to each other are connected through a transition portion 133, and there is a predetermined angle $\alpha$ between each transition portion 133 and the second direction Y. In this way, the distance between the first gate line 13 and the TFT 111 may be ensured to be large, so as to further ensure that the orthogonal projections of the first gate line 13 and the TFT 111 on the base 10 do not overlap.

For example, the predetermined angle $\alpha$ is 45°.

For example, as shown in FIG. 2, at a position where the TFT 111A is located, the first extension portion 131A and the second extension portion 132A that are adjacent to each other are connected through a transition portion 133A. As another example, as shown in FIG. 2, at a position where the TFT 111B is located, the first extension portion 131B and the second extension portion 132B that are adjacent to each other are connected through a transition portion 133B.

Figure 6:
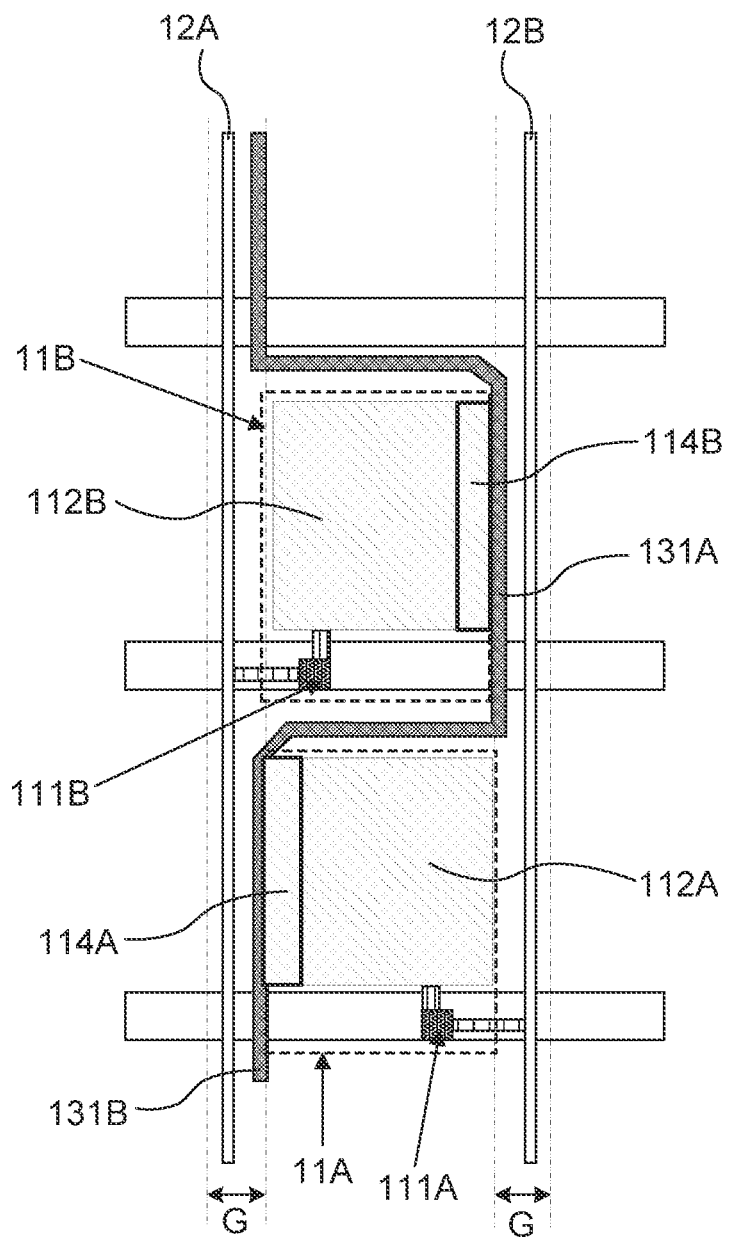
FIG. 6 is a schematic diagram illustrating a partial structure of a display substrate, in accordance with some embodiments.
Figure 7:
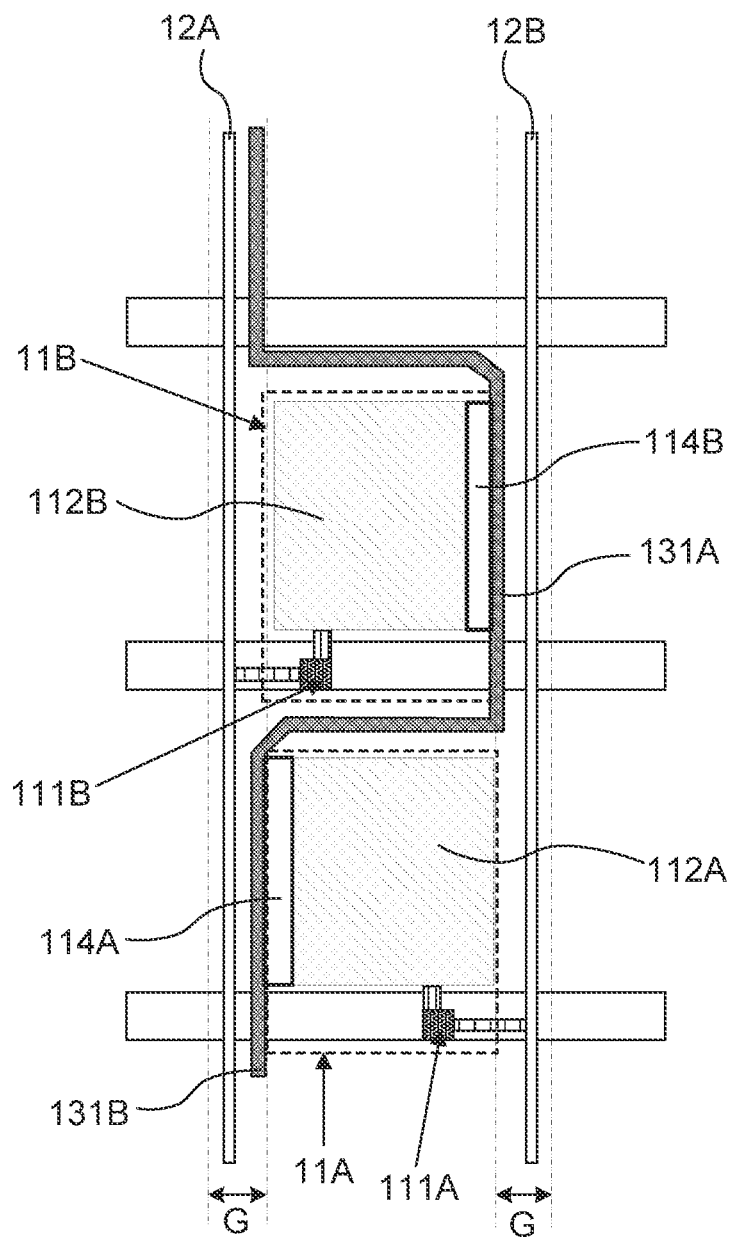
FIG. 7 is a schematic diagram illustrating a partial structure of another display substrate, in accordance with some embodiments.

In some examples, as shown in FIGS. 6 and 7, each pixel unit 11 includes an electrode 112 connected to the TFT 111 and a compensation electrode 114 connected to the electrode 112. The compensation electrode 114 is closer to the other data line 12, which is in the same gap G as the first extension portion 131 of the first gate line 13 corresponding to the pixel unit 11, than the electrode 112, so that a coupling capacitance between the electrode 112 and the compensation electrode 114 as a whole and one of two data lines located at two opposite sides of a column of pixel units 11 is equal to a coupling capacitance between the electrode 112 and the compensation electrode 114 as a whole and the other one of the two data lines 12.

For example, as shown in FIGS. 6 and 7, in two data lines 12A and 12B located at two opposite sides of a column of pixel units 11, in a case where the TFT 111B of the pixel unit 11B is connected to the data line 12A, and the first extension portion 131A of the first gate line 13 corresponding to the pixel unit 11B in the second direction Y and the data line 12B are located in the same gap G, the compensation electrode 114B is closer to the data line 12B than the electrode 112B.

As another example, as shown in FIGS. 6 and 7, in two data lines 12A and 12B located at two opposite sides of a column of pixel units 11, in a case where the TFT 111A of the pixel unit 11A is connected to the data line 12B, and the first extension portion 131B of the first gate line 13 corresponding to the pixel unit 11A in the second direction Y and the data line 12A are located in the same gap G, the compensation electrode 114A is closer to the data line 12A than the electrode 112A.

Since the first extension portion 131 of the first gate line 13 is located between the data line 12 and the electrode 112, distances between the electrode 112 and the two data lines 12 adjacent thereto are not equal, which causes a phenomenon of vertical crosstalk due to a case where different data lines 12 have different driving signals to different pixel units 11 connected thereto, and in turn resulting in a poor display quality of the display apparatus 100. The compensation electrode 114 is disposed between the data line 12 and the electrode 112, and is electrically connected to the electrode 112 as a whole, which may ensure that the driving signals of different data lines 12 to the pixel units 11 connected thereto are substantially consistent, thereby improving the phenomenon of vertical crosstalk.

For example, as shown in FIG. 6, the compensation electrode 114 is a plate-shaped electrode, and the compensation electrode 114 may be formed integrally with the electrode 112, thereby simplifying the manufacturing process. In this case, the distances between the compensation electrode 114 and the electrode 112 as a whole and the two data lines 12 adjacent thereto are substantially equal, so that the coupling capacitances between the two data lines 12 and the compensation electrode 114 and the electrode 112 that are formed integrally are substantially equal.

For example, as shown in FIG. 7, the compensation electrode 114 has a hollowed-out pattern. Based on this, an area of the hollow-out pattern may increase as much as possible, that is, an overlapping area of an orthogonal projection of the compensation electrode 1114 on the base 10 and the orthogonal projection of the first gate line 13 on the base 10 may be reduced as much as possible, so that a parasitic capacitance between the compensation electrode 114 and the first gate line 13 may be reduced, and the good display effect of the display apparatus 100 may be ensured.

Figure 8:
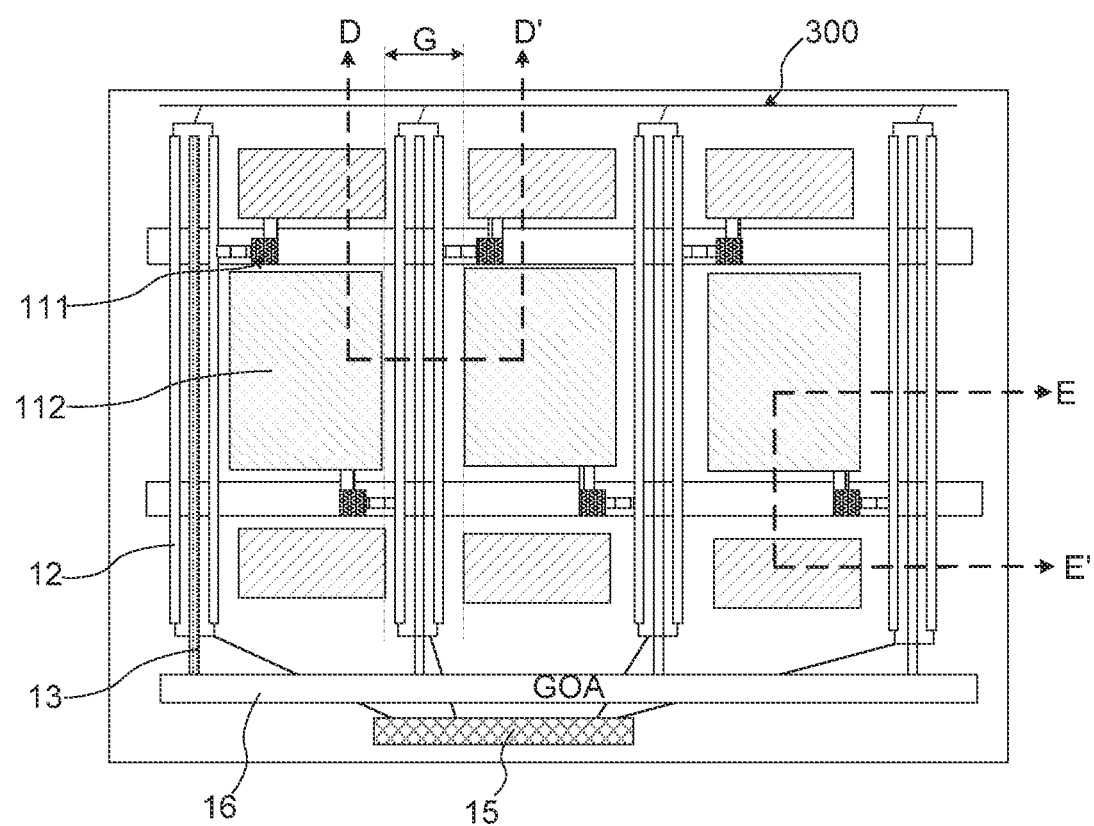
FIG. 8 is a schematic diagram illustrating a structure of yet another display substrate, in accordance with some embodiments.
Figure 9:
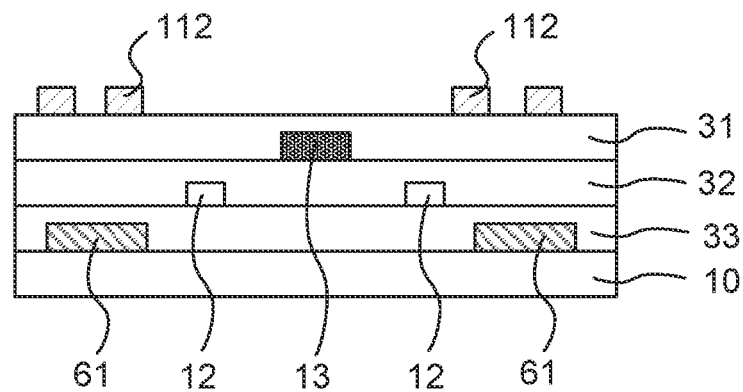
FIG. 9 is a sectional view of the display substrate in FIG. 8 taken along the line D-D'.

In some other embodiments, as shown in FIG. 8, two data lines 12 connected to each other are disposed in a gap G between adjacent columns of pixel units 11, and the first gate line 13 located in the same gap G as the two data lines 12 extends in the first direction X between the two data lines 12. As shown in FIG. 9, the orthogonal projection of the first gate line 13 on the base 10 is located between orthogonal projections of the two data lines 12 on the base 10. In this way, parasitic capacitances generated between the two data lines 12 and the first gate line 13 may be effectively reduced.

In the embodiments of the present disclosure, the two data lines 12 located in the same gap G may be connected to each other at least at one ends thereof proximate to a circuit structure (i.e., the source driver IC 15) for providing data voltages to the data lines 12, or may be connected at both ends thereof, which is not limited in the embodiments of the present disclosure. For example, as shown in FIG. 8, the two data lines 12 located in the same gap G are electrically connected at both ends. One ends of the two data lines are electrically connected at a position proximate to the source driver IC 15 and then connected to the source driver IC 15, and the other ends of the two data lines are electrically connected and then connected to the same electrostatic discharge circuit 300.

In some examples, as shown in FIG. 9, the orthogonal projections, on the base 10, of the first gate line 13 and the two data lines 12 connected to each other are arranged in parallel and at equal intervals. Therefore, an electric field of the first gate line 13 may be effectively shielded by the data lines 12, and the coupling capacitance of the first gate line 13 and the electrode 112 is further reduced. Meanwhile, the driving signals of the two data lines 12 to their respectively connected pixel unit 11 are ensured to be substantially equal, and the poor display quality of the display apparatus 100 is avoided.

Figure 10:
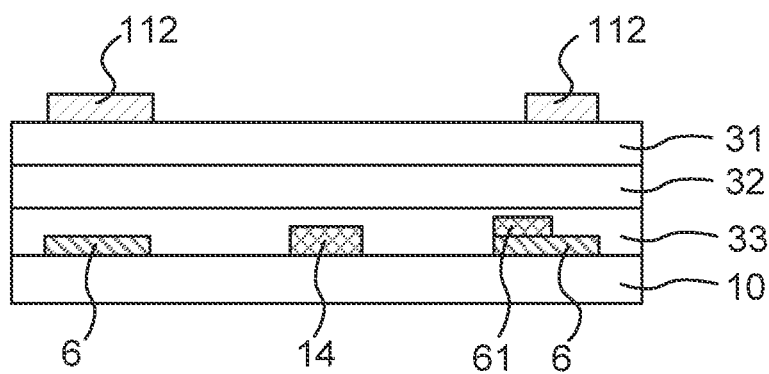
FIG. 10 is a sectional view of the display substrate in FIG. 8 taken along the line E-E'.

In some embodiments, the display apparatus 100 is an LCD, and the electrode 112 is a pixel electrode. Based on this, the display substrate 1 further includes a common electrode signal line and a common electrode located in each pixel 11 on the base 10. For example, as shown in FIG. 10, the common electrode signal line 61 and the second gate line 14 are disposed in the same layer. That is, the common electrode signal line 61 and the second gate line 14 may be made of the same material, such as copper, so that the manufacturing process may be simplified. The common electrode 6 is disposed between the common electrode signal line 61 and the base 10, and an orthogonal projection of the common electrode 6 on the base 10 overlaps with an orthogonal projection of the pixel electrode on the base 10. A material and a shape of the pixel electrode, a material and a shape of the common electrode, and a relative position of the pixel electrode and the common electrode may refer to the description above, which will not be repeated herein.

Based on this, for example, as shown in FIGS. 9 and 10, an interlayer insulating layer 31 is disposed between the electrode 112 and the first gate line 13, an interlayer insulating layer 32 is disposed between the first gate line 13 and the data line 12, and an interlayer insulating layer 33 is disposed between the data line 12 and the common electrode signal line 61.

Of course, a sectional structure of the display substrate 1 shown in FIG. 8 may also refer to the structures shown in FIGS. 3 to 5, which is not limited in the embodiments of the present disclosure.

In the embodiments of the present disclosure, in a case where the display apparatus is an OLED, the display apparatus further includes a plurality of light-emitting elements, and at least one light-emitting element is disposed in each pixel unit. The electrode 112 of each pixel unit 11 may be understood as an anode of a light-emitting element. In this case, each pixel unit 11 may include a plurality of TFTs 111, one of the plurality of TFTs 111 is connected to one data line 12, one of the plurality of TFTs 111 is connected to one second gate line 14, and one of the plurality of TFTs 111 is connected to one light-emitting element. Herein, the TFT 111 connected to the data line 12 and the TFT 111 connected to the second gate line 14 may be the same or different.

In addition, a shape and a material of the electrode 112 may be set according to a requirement of the light-emitting element of the pixel unit 11, and positional relationships between the electrode 112 and the first gate lines 13, the second gate lines 14, the data lines 12, and the TFTs 111 may refer to the above embodiments.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
    a base;
    a plurality of pixel units located on the base and arranged in columns in a first direction and in rows in a second direction, a pixel unit including a thin film transistor (TFT), the first direction intersecting with the second direction;
    a plurality of data lines located on the base, arranged in the second direction and extending in the first direction, the TFT being connected to a data line; wherein in a column of pixel units, TFTs of any two adjacent pixel units are located at a first side and a second side of a respective data line, the first side and the second side are opposite sides of the same data line;

a plurality of first gate lines located on the base, arranged in the second direction and extending in the first direction;

a plurality of second gate lines located on the base, arranged in the first direction and extending in the second direction; each second gate line being connected to a row of pixel units and at least one of the plurality of first gate lines, first gate lines connected to different second gate lines being different; and at least one gate driver circuit located on the base and connected to the plurality of first gate lines, the at least one gate driver circuit being disposed on a side of the display substrate parallel to the second direction;

wherein any two adjacent columns of pixel units have a gap therebetween, at least one data line is disposed in each gap, and one first gate line is disposed in each of at least part of gaps;

the at least one data line disposed in the gap includes one data line; and the first gate line includes a plurality of first extension portions and a plurality of second extension portions arranged alternately, each first extension portion extends in the first direction, each second extension portion extends in the second direction, any two adjacent first extension portions are respectively located at opposite sides of a column of pixel units, and any two adjacent second extension portions are respectively located at opposite sides of a row of pixel units.

2. The display substrate according to claim 1, wherein the pixel unit further includes an electrode connected to the TFT, the electrode and the TFT are stacked in a direction perpendicular to a plane where the base is located; the TFT includes a first electrode, a second electrode, and a gate, the plurality of second gate lines and the gate are disposed in the same layer, the display substrate further comprises:

an organic film located between the electrode and the TFT and having a plurality of via holes, wherein the plurality of first gate lines are located between the organic film and the electrode, each first gate line is connected to one second gate line through one of the plurality of via holes.

3. The display substrate according to claim 2, wherein an orthogonal projection of each first gate line on the base is located between orthogonal projections of two adjacent data lines on the base.

4. The display substrate according to claim 1, wherein the pixel unit further includes an electrode connected to the TFT, the electrode and the TFT are stacked in a direction perpendicular to a plane where the base is located, the TFT includes a first electrode, a second electrode, and a gate, the plurality of first gate lines are disposed on a side of the TFT away from the base, the plurality of second gate lines and the gate are disposed in the same layer, the display substrate further comprises:

an interlayer insulating layer located between the electrode and the TFT and having a plurality of via holes, each first gate line being connected to one second gate line through one of the plurality of via holes.

5. The display substrate according to claim 4, wherein a distance between orthogonal projections, on the base, of a first gate line and a data line in the same gap is less than a width of the data line.

6. The display substrate according to claim 4, further comprising: a filling layer disposed in the via hole, the filling layer and the electrode being disposed in the same layer.

7. The display substrate according to claim 1, wherein the pixel unit further includes an electrode connected to the TFT, the electrode and the TFT are stacked in a direction perpendicular to a plane where the base is located, the TFT includes a first electrode, a second electrode, and a gate, the plurality of first gate lines and the first electrode are disposed in the same layer, the plurality of second gate lines and the gate are disposed in the same layer, the display substrate further comprises:

an interlayer insulating layer located between the electrode and the TFT and having a plurality of via holes, each first gate line being connected to one second gate line through one of the plurality of via holes.

8. The display substrate according to claim 7, further comprising: a filling layer disposed in the via hole, the filling layer and the electrode being disposed in the same layer.

9. The display substrate according to claim 7, wherein a distance between orthogonal projections, on the base, of a first gate line and a data line in the same gap is greater than a width of the data line.

10. The display substrate according to claim 1, wherein the pixel unit further includes a connection portion, an end of the connection portion is connected to a data line corresponding to the pixel unit, another end of the connection portion is connected to the TFT, and an orthogonal projection of each first gate line on the base is non-overlapping with an orthogonal projection of the connection portion on the base.

11. The display substrate according to claim 1, wherein in two data lines located at opposite sides of a column of pixel units, a TFT of any pixel unit is connected to one of the two data lines, and a first extension portion corresponding to the pixel unit and another of the two data lines are located in the same gap.

12. The display substrate according to claim 11, wherein the first gate line further includes a plurality of transition portions, a first extension portion and a second extension portion adjacent thereto are connected through one transition portion at a position where the TFT is located, and there is a predetermined angle between the transition portion and the second direction.

13. The display substrate according to claim 11, wherein the pixel unit further includes an electrode connected to the TFT and a compensation electrode connected to the electrode, the compensation electrode is closer to the another data line, which is in the same gap as the first extension portion corresponding to the pixel unit, than the electrode, so that a coupling capacitance between the electrode and the compensation electrode as a whole and one of the two data lines is equal to a coupling capacitance between the electrode and the compensation electrode as a whole and the another of the two data lines.

14. The display substrate according to claim 13, wherein the compensation electrode has a hollow-out pattern.

15. The display substrate according to claim 1, wherein a width of the first gate line is greater than a width of the data line.

16. A display apparatus, comprising:
a display substrate according to claim 1.

17. A display substrate, comprising:
a base;
a plurality of pixel units located on the base and arranged in columns in a first direction and in rows in a second direction, a pixel unit including a thin film transistor (TFT), the first direction intersecting with the second direction;

a plurality of data lines located on the base, arranged in the second direction and extending in the first direction, the TFT being connected to a data line; wherein in a column of pixel units, TFTs of any two adjacent pixel units are located at a first side and a second side of a respective data line, the first side and the second side are opposite sides of the same data line;

a plurality of first gate lines located on the base, arranged in the second direction and extending in the first direction;

a plurality of second gate lines located on the base, arranged in the first direction and extending in the second direction; each second gate line being connected to a row of pixel units and at least one of the plurality of first gate lines, first gate lines connected to different second gate lines being different; and at least one gate driver circuit located on the base and connected to the plurality of first gate lines, the at least one gate driver circuit being disposed on a side of the display substrate parallel to the second direction;

wherein any two adjacent columns of pixel units have a gap therebetween, at least one data line is disposed in each gap, and one first gate line is disposed in each of at least part of gaps; and the at least one data line disposed in the gap includes two data lines connected to each other, an orthogonal projection of the first gate line on the base is located between orthogonal projections, on the base, of the two data lines connected to each other.

18. The display substrate according to claim 17, wherein the orthogonal projections, on the base, of the two data lines connected to each other and the first gate line are arranged in parallel and at equal intervals.

19. The display substrate according to claim 17, wherein a width of the first gate line is greater than a width of the data line.

20. A display apparatus, comprising:
a display substrate according to claim 17.

* * * * *